United States Patent
Watabe

(10) Patent No.: US 9,922,944 B2
(45) Date of Patent: Mar. 20, 2018

(54) METHOD FOR MANUFACTURING SEMICONDUCTOR DEVICE

(71) Applicant: Mitsubishi Electric Corporation, Tokyo (JP)

(72) Inventor: Shunichi Watabe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/534,867

(22) PCT Filed: Feb. 12, 2015

(86) PCT No.: PCT/JP2015/053788
§ 371 (c)(1),
(2) Date: Jun. 9, 2017

(87) PCT Pub. No.: WO2016/129076
PCT Pub. Date: Aug. 18, 2016

(65) Prior Publication Data
US 2017/0345777 A1   Nov. 30, 2017

(51) Int. Cl.
*H01L 23/58* (2006.01)
*H01L 21/02* (2006.01)
*H01L 23/31* (2006.01)
*H01L 23/00* (2006.01)

(52) U.S. Cl.
CPC ...... *H01L 23/585* (2013.01); *H01L 21/02016* (2013.01); *H01L 23/3192* (2013.01); *H01L 23/562* (2013.01); *H01L 23/564* (2013.01)

(58) Field of Classification Search
CPC . H01L 23/585; H01L 23/3192; H01L 23/564; H01L 21/02016; H01L 23/562; B29C 37/006; B29C 37/0053; G03F 7/0002; B82Y 10/00; B82Y 40/00
See application file for complete search history.

(56) References Cited

U.S. PATENT DOCUMENTS

2008/0003830 A1* 1/2008 Qing ................ H01L 21/02087
438/694
2009/0267192 A1* 10/2009 Anderson ......... H01L 21/31053
257/618

FOREIGN PATENT DOCUMENTS

JP    2005-064326 A    3/2005

OTHER PUBLICATIONS

International Search Report issued in PCT/JP2015/053788; dated Apr. 14, 2015.

* cited by examiner

*Primary Examiner* — Jessica Manno
*Assistant Examiner* — Mohammed R Alam
(74) *Attorney, Agent, or Firm* — Studebaker & Brackett PC

(57) ABSTRACT

A first film (3) is formed on a front surface of a semiconductor wafer (1). A second film (4) is formed on the first film (3). A surface protection film (5) is formed to cover the first film (3) and second film (4). After forming the surface protection film (5), a reverse surface of the semiconductor wafer (1) is etched with a chemical liquid. The first film (3) is formed on an outer peripheral section of the semiconductor wafer (1). The second film (4) is not formed on the outer peripheral section of the semiconductor wafer (1). The first film (3) and the surface protection film (5) are adhered to each other in the outer peripheral section of the semiconductor wafer (1). The first film (3) has a higher adhesion to the surface protection film (5) than the second film (4).

4 Claims, 3 Drawing Sheets

METHOD FOR MANUFACTURING SEMICONDUCTOR DEVICE

FIELD

The present invention relates to a method for manufacturing a semiconductor device by etching the reverse surface of a semiconductor wafer with a chemical liquid, while protecting the front surface thereof with a surface protection film.

BACKGROUND ART

With advances in compactification and increased density in semiconductors, such as LSIs, particular progress has been made in recent years in compactification and increased density in the thickness direction of semiconductor devices, by three-dimensional mounting, for instance. In conjunction with this, in a step for manufacturing a semiconductor device, reverse surface processing is carried out to process the reverse surface on the opposite side to the front surface on which the device is formed, for instance, a step for reducing the thickness of the semiconductor wafer. Furthermore, also in a power device such as an IGBT, MOSFET or diode, which is mounted on an inverter circuit or uninterrupted power source device, etc. which is used for driving an industrial or automobile motor, a thickness reduction step is carried out on the semiconductor wafer, in order to improve the activation performance, such as the on characteristics. Moreover, forming an impurity layer or reverse surface electrode, etc. is also carried out as reverse surface processing.

In general, after first carrying out mechanical polishing of the reverse surface side as a reserve surface process on the semiconductor wafer, a semiconductor wafer thickness reduction process is carried out by chemical etching using a chemical liquid in order to remove stress and fractured layers from the polishing. As a pre-process for this step, a surface protection film is formed in order to protect the device on the front surface side from scratches and chemical liquid. The chemical etching process after the mechanical polishing is carried out by rotary wafer etching in which chemical liquid is supplied to one side only, while rotating the semiconductor wafer.

However, due to the surface tension of the chemical liquid, the chemical liquid also flows around to the outer peripheral section of the surface on the opposite side to the etching process surface, and the chemical liquid penetrates in between the surface of the semiconductor wafer and the protection film. Consequently, there is a problem in that the protection film in the outer peripheral section detaches, and the yield rate of the device declines due to conveyance errors and processing defects of the semiconductor wafer in post-processing, and scratching of the device surface and corrosion by the chemical liquid.

In order to avoid corrosion of the surface by the chemical liquid, it has been proposed that the diameter of the surface protection film be made larger than the device surface and smaller than the diameter of the periphery of the semiconductor wafer (see, for example, PTL 1).

CITATION LIST

Patent Literature

[PTL 1] Japanese Patent Application Publication No. 2005-64326

SUMMARY OF INVENTION

Technical Problem

The flow-around of the chemical liquid due to the surface tension is several mm or more, but with the method in Patent Document 1, the diameter of the surface protection film must be reduced up to the inner side, due to the flow-around of the chemical liquid, and there is a problem in that the device region must be sacrificed.

The present invention was devised in order to resolve the problem described above, an object thereof being to provide a method for manufacturing a semiconductor device whereby detachment of a surface protection film in reverse surface processing of a semiconductor wafer can be suppressed.

Solution to Problem

A method for manufacturing a semiconductor device according to the present invention includes: forming a first film on a front surface of a semiconductor wafer; forming a second film on the first film; forming a surface protection film to cover the first and second films; and after forming the surface protection film, etching a reverse surface of the semiconductor wafer with a chemical liquid, wherein the first film is formed on an outer peripheral section of the semiconductor wafer, the second film is not formed on the outer peripheral section of the semiconductor wafer, the first film and the surface protection film are adhered to each other in the outer peripheral section of the semiconductor wafer, and the first film has a higher adhesion to the surface protection film than the second film.

Advantageous Effects of Invention

In the present invention, the second film which has low adhesion strength is not formed and the surface protection is adhered to the first film which has a high adhesion strength in the outer peripheral section of the semiconductor wafer. Therefore, detachment of the surface protection film in reverse surface processing of the semiconductor wafer can be suppressed.

DESCRIPTION OF EMBODIMENTS

A method for manufacturing a semiconductor device according to the embodiments of the present invention will be described with reference to the drawings. The same components will be denoted by the same symbols, and the repeated description thereof may be omitted.

First Embodiment

Figure 1:
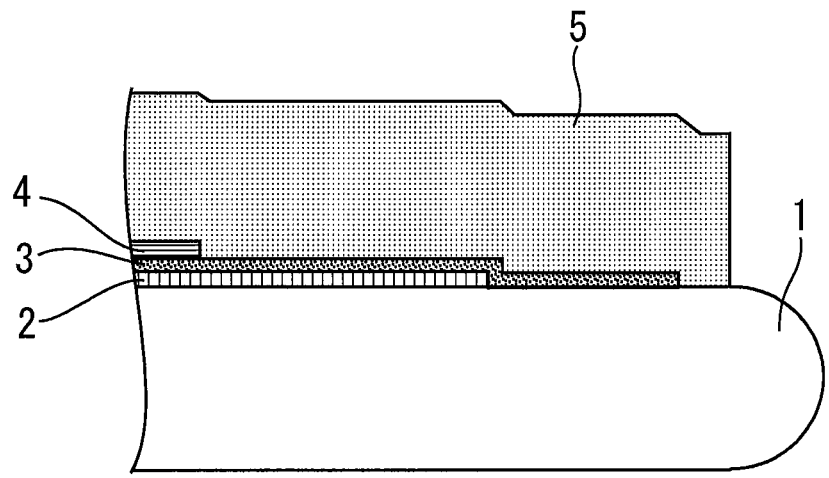
FIG. 1 is a cross-sectional diagram for describing a method for manufacturing a semiconductor device according to a first embodiment of the present invention.

FIG. 1 is a cross-sectional diagram for describing a method for manufacturing a semiconductor device according to a first embodiment of the present invention.

Firstly, a silicon oxide film 2 is formed on the front surface of a silicon wafer 1. Next, an aluminum wiring layer 3 is formed on the silicon oxide film 2. The aluminum wiring layer 3 is also formed on the outer peripheral section of the silicon wafer 1. The silicon oxide film 2 is an interlayer insulating film for insulating the aluminum wiring layer 3 from the silicon wafer 1.

Next, a silicon nitride film 4 for protecting the aluminum wiring layer 3 is formed on the aluminum wiring layer 3. The silicon nitride film 4 is formed to the inside of the end portion of the aluminum wiring layer 3, and is not formed on the outer peripheral section of the silicon wafer 1. The silicon oxide film 2, the aluminum wiring layer 3 and the silicon nitride film 4 are a portion of the device that is formed on the front surface of the silicon wafer 1. These films are formed by respectively varying the edge rinse width in the resist application step, but may also be formed by exposure and development of the resist.

Next, a surface protection film 5 of polyimide is formed so as to cover the aluminum wiring layer 3 and the silicon nitride film 4. In this case, the aluminum wiring layer 3 and the surface protection film 5 are adhered to each other in the outer peripheral section of the silicon wafer 1. Next, reverse surface processing for etching the reverse surface of the silicon wafer 1 with a chemical liquid after mechanical polishing in the wafer thickness reduction step is carried out.

As a result of evaluation of the respective films which constitute the device in respect of their adhesion to the polyimide surface protection film 5, aluminum had the highest adhesion, and the silicon nitride film had the lowest adhesion. Therefore, the aluminum wiring layer 3 has a higher adhesion to the surface protection film 5 than the silicon nitride film 4.

Figure 2:
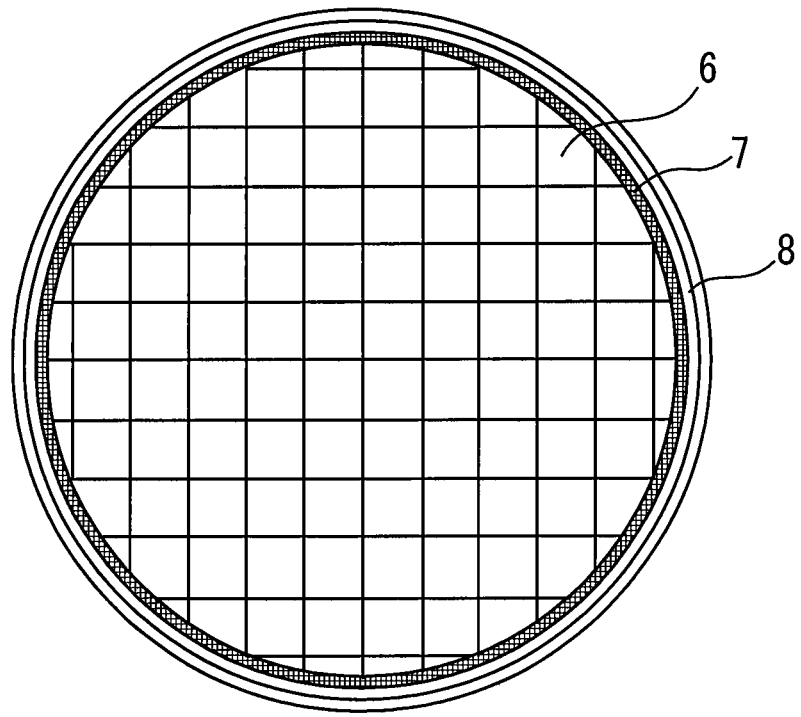
FIG. 2 is a plan diagram illustrating a front surface side during reverse surface processing of a semiconductor device according to a first embodiment of the present invention.

FIG. 2 is a plan diagram illustrating a front surface side during reverse surface processing of a semiconductor device according to a first embodiment of the present invention. 6 is a device region, of which the outermost surface is covered with a surface protection film 5. 7 is a region where the aluminum wiring layer 3 and the surface protection film 5 are adhered to each other, which is disposed so as to surround the whole outer periphery of the silicon wafer 1. 8 is a region where the silicon wafer 1 and the surface protection film 5 are adhered to each other on the outside of the end portion of the aluminum wiring layer 3.

Figure 3:
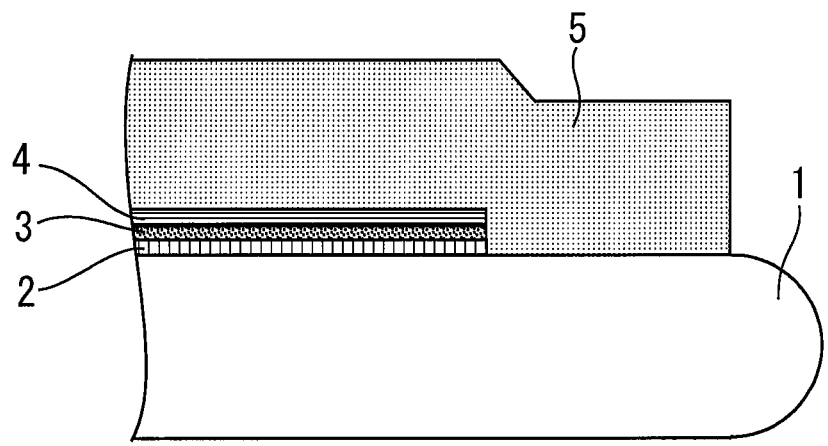
FIG. 3 is a cross-sectional diagram for describing a method for manufacturing a semiconductor device according to a comparative example.

Next, the effects of the present embodiment are described in relation to a comparative example. FIG. 3 is a cross-sectional diagram for describing a method for manufacturing a semiconductor device according to a comparative example. In the comparative example, a silicon nitride film 4 having a low adhesion strength is formed in the outer peripheral section of the silicon wafer 1. Therefore, the adhesion with the surface protection film 5 is low in the outer peripheral section of the silicon wafer 1.

On the other hand, in the present embodiment, a silicon nitride film 4 which has low adhesion strength is not formed and the surface protection 5 is adhered to the aluminum wiring layer 3 which has a high adhesion strength in the outer peripheral section of the silicon wafer 1. Therefore, the penetration of chemical liquid which has flowed around onto the front surface during a chemical etching process after the mechanical polishing in the wafer thickness reduction step is suppressed by the adhered section between the aluminum wiring layer 3 and the surface protection film 5. Consequently, it is possible to suppress detachment of the surface protection film 5 during reverse surface processing of the semiconductor wafer. Furthermore, it is also possible to prevent penetration of the chemical liquid into the device region in the inside of the wafer. Consequently, it is possible to prevent conveyance errors or processing errors in post-processing, due to detachment of the surface protection film, or scratches on the surface of the device, or decline in the yield rate due to corrosion by the chemical liquid.

Second Embodiment

Figure 4:
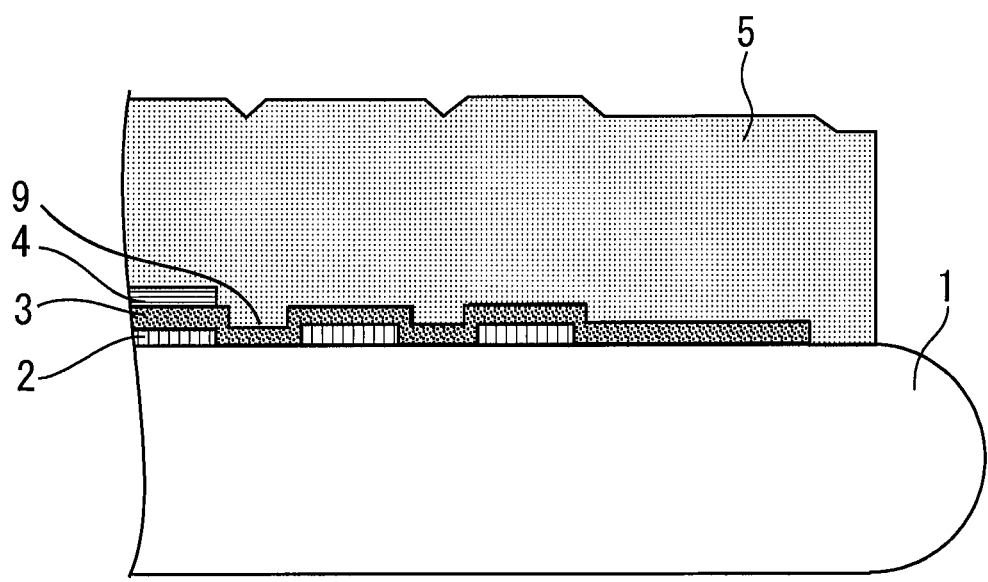
FIG. 4 is a cross-sectional diagram for describing a method for manufacturing a semiconductor device according to a second embodiment of the present invention.

FIG. 4 is a cross-sectional diagram for describing a method for manufacturing a semiconductor device according to a second embodiment of the present invention. In the present embodiment, a step 9 is formed on a silicon oxide film 2 in the outer peripheral section of a silicon wafer 1 and an aluminum wiring layer 3 is formed on the silicon oxide film 2 on which this step 9 has been formed. Consequently, a step is also formed on the surface of the aluminum wiring layer 3, and therefore the contact surface area between the surface protection film 5 and the aluminum wiring layer 3 is increased and the adhesion is further improved.

Third Embodiment

Figure 5:
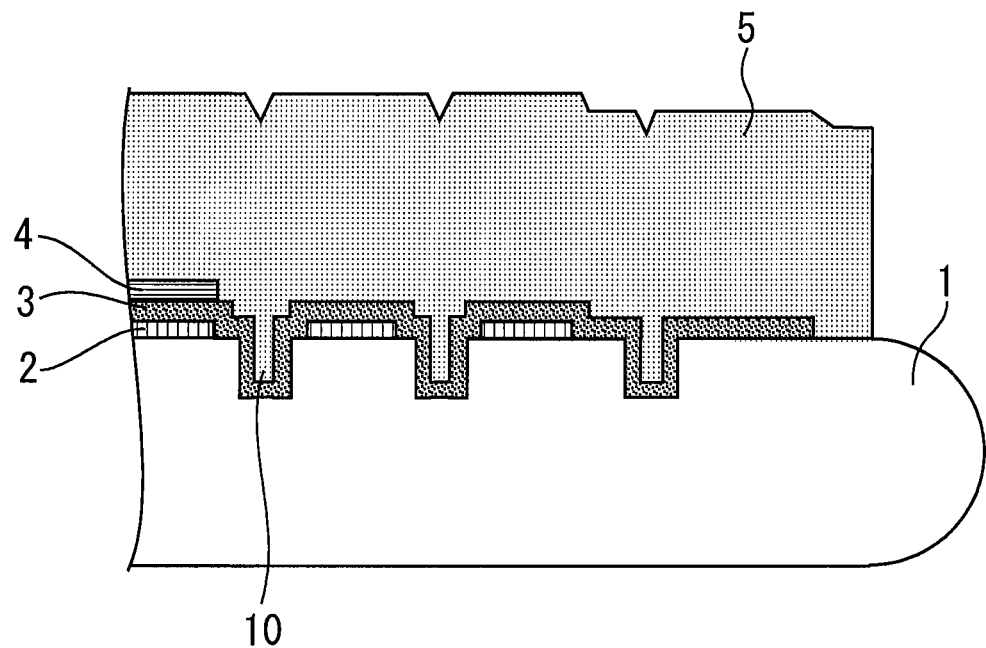
FIG. 5 is a cross-sectional diagram for describing a method for manufacturing a semiconductor device according to a third embodiment of the present invention.

FIG. 5 is a cross-sectional diagram for describing a method for manufacturing a semiconductor device according to a third embodiment of the present invention. In the present embodiment, a step 10 is formed on a front surface of a silicon wafer 1 in the outer peripheral section of the silicon wafer 1, and an aluminum wiring layer 3 is formed on the surface of the silicon wafer 1 on which the step 10 has been formed. Consequently, a step is also formed in the front surface of the aluminum wiring layer 3, and therefore the contact surface area between the surface protection film 5 and the aluminum wiring layer 3 is increased and the adhesion is further improved.

Fourth Embodiment

Figure 6:
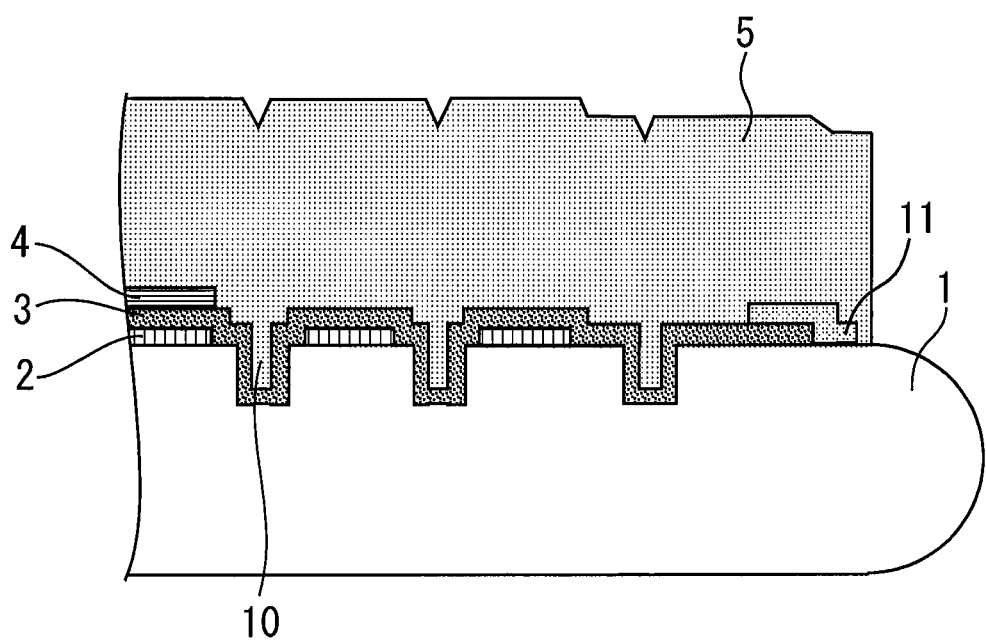
FIG. 6 is a cross-sectional diagram for describing a method for manufacturing a semiconductor device according to a fourth embodiment of the present invention.

FIG. 6 is a cross-sectional diagram for describing a method for manufacturing a semiconductor device according to a fourth embodiment of the present invention. In the present embodiment, an adhesion strengthening film 11 that has higher adhesion to a surface protection film 5 than an aluminum wiring layer 3 is formed on the aluminum wiring layer 3 in the outer peripheral section of a silicon wafer 1. Furthermore, a surface protection film 5 is formed so as to cover the adhesion strengthening film 11 and the adhesion strengthening film 11 and the surface protection film 5 are adhered to each other. By providing an adhesion strengthening film 11 in this way, the adhesion to the surface protection film 5 is further improved in the outer peripheral section of the silicon wafer 1.

The first to fourth embodiments were described with reference to a case where the surface protection film 5 is made of polyimide, but the surface protection film 5 may be made of tape or film. Furthermore, the materials of the films constituting the device are not limited to the examples given above, and the number of stacked films is not limited to three layers and may be any number of layers equal to or greater than two.

REFERENCE SIGNS LIST

1 silicon wafer (semiconductor wafer); 2 silicon oxide film (lower film); 3 aluminum wiring layer (first film); 4 silicon nitride film (second film); 5 surface protection film; 9,10 step; 11 adhesion strengthening film

The invention claimed is:

1. A method for manufacturing a semiconductor device comprising:
forming a first film on a front surface of a semiconductor wafer;
forming a second film on the first film;
forming a surface protection film to cover the first and second films; and
after forming the surface protection film, etching a reverse surface of the semiconductor wafer with a chemical liquid,
wherein the first film is formed on an outer peripheral section of the semiconductor wafer,
the second film is not formed on the outer peripheral section of the semiconductor wafer,
the first film and the surface protection film are adhered to each other in the outer peripheral section of the semiconductor wafer, and
the first film has a higher adhesion to the surface protection film than the second film.

2. The method for manufacturing a semiconductor device according to claim 1, further comprising:
forming a lower film on the front surface of the semiconductor wafer; and
forming a step on the lower film in the outer peripheral section of the semiconductor wafer,
wherein the first film is formed on the lower film on which the step is formed.

3. The method for manufacturing a semiconductor device according to claim 1, further comprising forming a step on the front surface of the semiconductor wafer in the outer peripheral section of the semiconductor wafer,
wherein the first film is formed on the front surface of the semiconductor wafer on which the step is formed.

4. The method for manufacturing a semiconductor device according to claim 1, further comprising forming an adhesion strengthening film that has higher adhesion to the surface protection film than the first film on the first film in the outer peripheral section of the semiconductor wafer,
wherein the surface protection film is formed to cover the adhesion strengthening film, and
the adhesion strengthening film and the surface protection film are adhered to each other.

* * * * *